(12) United States Patent
Managaki

(10) Patent No.: US 12,396,320 B2
(45) Date of Patent: Aug. 19, 2025

(54) DISPLAY DEVICE

(71) Applicant: Magnolia White Corporation, Tokyo (JP)

(72) Inventor: Nobuto Managaki, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 359 days.

(21) Appl. No.: 17/987,861

(22) Filed: Nov. 16, 2022

(65) Prior Publication Data

US 2023/0157051 A1 May 18, 2023

(30) Foreign Application Priority Data

Nov. 17, 2021 (JP) .................. 2021-187175

(51) Int. Cl.
| | |
|---|---|
| *H10K 50/822* | (2023.01) |
| *H10K 50/16* | (2023.01) |
| *H10K 59/80* | (2023.01) |
| *H10K 102/00* | (2023.01) |

(52) U.S. Cl.
CPC .......... *H10K 50/822* (2023.02); *H10K 50/16* (2023.02); *H10K 59/80521* (2023.02); *H10K 2102/351* (2023.02)

(58) Field of Classification Search
CPC ............ H10K 50/16; H10K 2102/351; H10K 50/822; H10K 59/80521
See application file for complete search history.

(56) References Cited

U.S. PATENT DOCUMENTS

| | | | |
|---|---|---|---|
| 2007/0188081 A1* | 8/2007 | Lee ................. | H10K 59/173 313/506 |
| 2009/0051275 A1* | 2/2009 | Kobayashi .......... | H10K 59/876 257/E21.007 |
| 2016/0155978 A1* | 6/2016 | Park .................. | H10K 50/16 438/46 |
| 2016/0248035 A1* | 8/2016 | Hwang ............... | H10K 59/122 |
| 2017/0229675 A1* | 8/2017 | Riedel ................ | H10K 50/82 |
| 2020/0035760 A1* | 1/2020 | Park .................. | H10K 50/18 |
| 2021/0143357 A1* | 5/2021 | Katsushi ............. | H10K 50/15 |

FOREIGN PATENT DOCUMENTS

JP          11-307270 A          11/1999

* cited by examiner

*Primary Examiner* — Alia Sabur
(74) *Attorney, Agent, or Firm* — XSENSUS LLP

(57) ABSTRACT

According to one embodiment, in a display device, end portions of a hole-transport layer, a light emitting layer and an electron-transport layer provided in a pixel are spaced apart from end portions of applicable layers of an adjacent pixel. The electron-transport layer includes a first area and a second area having a film thickness greater than that of the first area. The second area overlaps a common electrode, and the first area does not overlap the common electrode.

6 Claims, 9 Drawing Sheets

DISPLAY DEVICE

CROSS-REFERENCE TO RELATED APPLICATIONS

This application is based upon and claims the benefit of priority from Japanese Patent Application No. 2021-187175, filed Nov. 17, 2021, the entire contents of which are incorporated herein by reference.

FIELD

Embodiments described herein relate generally to a display device.

BACKGROUND

In recent years, display devices using an organic electroluminescent (EL) light emitting material have been developed. A display device comprises an organic EL layer containing a light emitting material. In the organic layer of an organic EL element, the light emitting material is excited by recombination between an electron and a positive hole. When the light emitting material returns to the ground state, light emission occurs.

DETAILED DESCRIPTION

Figure 1:
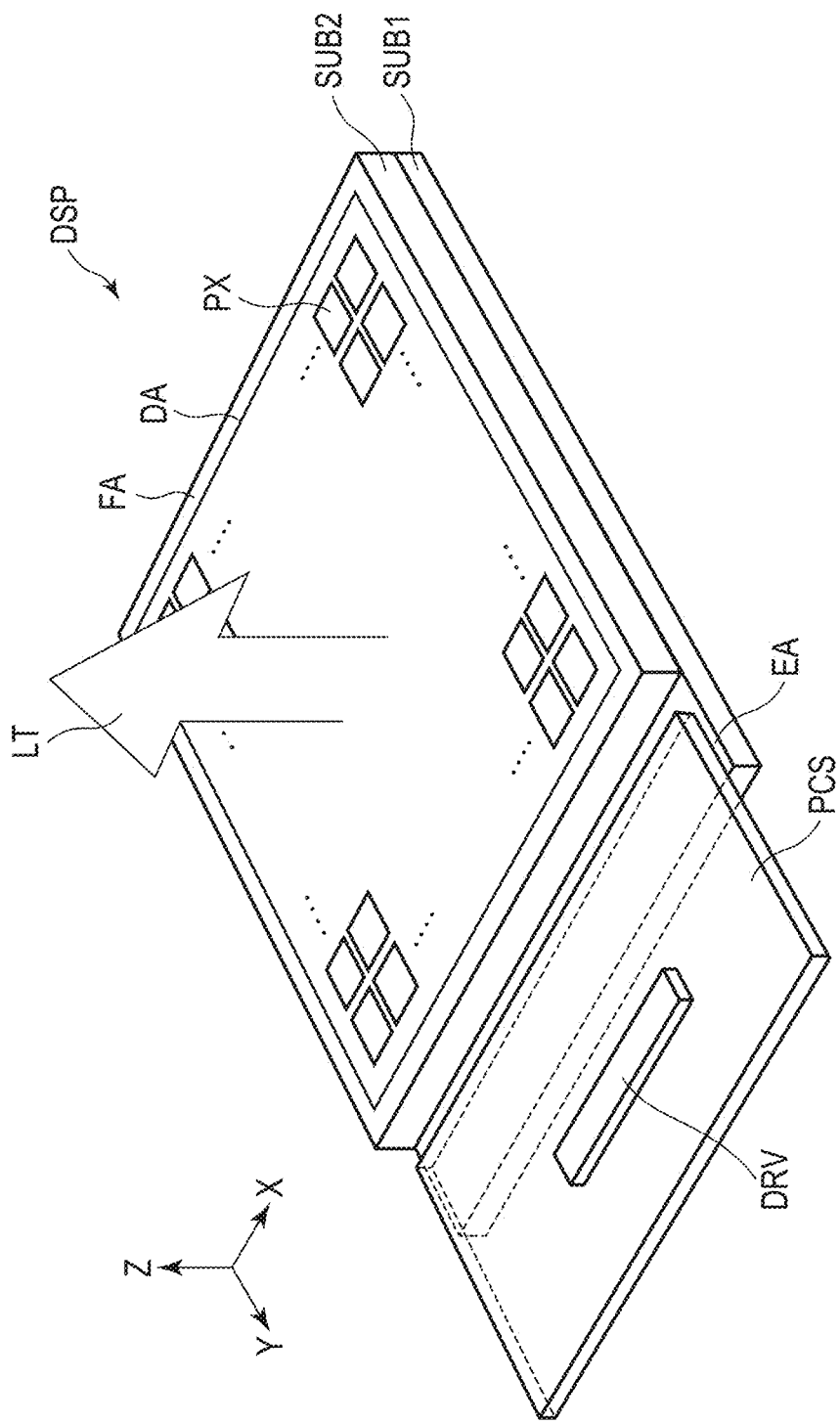
FIG. 1 is an overall perspective view of a display device according to embodiment 1.

In general, according to one embodiment, a display device comprising a pixel comprising a pixel electrode, a hole-transport layer, a light emitting layer, an electron-transport layer and a common electrode, wherein end portions of the hole-transport layer, the light emitting layer and the electron-transport layer provided in the pixel are spaced apart from end portions of a hole-transport layer, a light emitting layer and an electron-transport layer of an adjacent pixel, the electron-transport layer comprises a first area having a first film thickness, and a second area having a second film thickness greater than the first film thickness, and the second area overlaps the common electrode, and the first area does not overlap the common electrode.

The present embodiment provides a display device which can prevent the reduction in the efficiency of extraction of light, the generation of leak current and unintentional light emission of a light emitting layer.

Various embodiments of the present invention will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

This specification hereinafter explains a display device according to an embodiment in detail with reference to the accompanying drawings.

In the present embodiment, a first direction X, a second direction Y and a third direction Z are orthogonal to each other. However, they may intersect each other at an angle other than 90 degrees. The third direction Z is defined as a direction to the upper side or an upward direction. The opposite direction of the third direction Z is defined as a direction to the lower side or a downward direction. The first direction X, the second direction Y and the third direction Z may be also referred to as an X direction, a Y direction and a Z direction, respectively.

When this specification uses the phrases "a second member above a first member" and "a second member on the lower side of a first member", the second member may be in contact with the first member, or may be spaced apart from the first member. In the latter case, a third member may be interposed between the first member and the second member. When this specification uses the phases "a second member on a first member" and "a second member under a first member", the second member is in contact with the first member.

It is assumed that an observation position for observing the display device is on the tip side of the arrow of the third direction Z. When the X-Y plane defined by the first direction X and the second direction Y is viewed at the observation position, the appearance is referred to as a plan view. When the section of the display device in the X-Z plane defined by the first direction X and the third direction Z or in the Y-Z plane defined by the second direction Y and the third direction Z is viewed, the appearance is referred to as a cross-sectional view.

Embodiment

FIG. 1 is an overall perspective view of a display device according to embodiment 1. The display device DSP comprises, in a substrate SUB1, a display area DA and a peripheral area FA provided around the display area DA. The display device DSP comprises a plurality of pixels PX provided in the display area DA. Light LT passes through the display device DSP from the back side to the adverse side as well as passing through the display device DSP in the opposite direction.

A substrate SUB2 is provided as a sealing member on the top surface of the display area DA. The substrate SUB2 is fixed to the substrate SUB1 by a sealing material (not shown) surrounding the display area DA. The display area DA formed in the substrate SUB1 is sealed by the substrate SUB2 as a sealing member and the sealing material such that the display area DA is not exposed to air.

An area EA which is an end portion of the substrate SUB1 is provided outside the substrate SUB2. In the area EA, a circuit substrate PCS is provided. In the circuit substrate PCS, a driver element DRV which outputs a video signal and a drive signal is provided. The signals from the driver element DRV are input to the pixels PX of the display area DA via the circuit substrate PCS. Based on video signals and various control signals, the pixels PX emit light.

Figure 2:
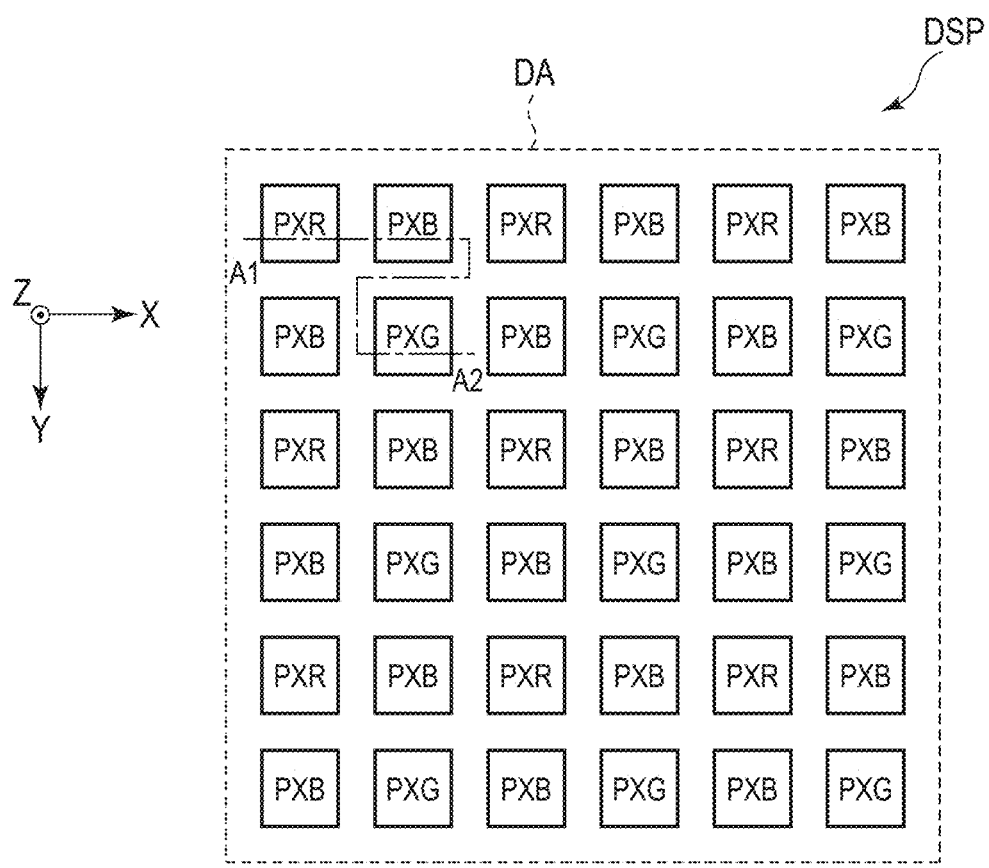
FIG. 2 is a partial plan view showing an example of the general configuration of the display device.

FIG. 2 is a partial plan view showing an example of the general configuration of the display device. The pixels PX include pixels PXR which emit red light, pixels PXG which emit green light and pixels PXB which emit blue light. Pixels PXR, PXG and PXB may be also called first, second and third pixels, respectively. Pixel PXR is provided so as to be adjacent to pixel PXB in the first direction X and the second direction Y. Pixel PXG is provided so as to be adjacent to pixel PXB in the first direction X and the second direction Y. Pixel PXB is provided so as to be adjacent to pixel PXR in the first direction and is provided so as to be adjacent to pixel PXG in the second direction Y.

Figure 3:
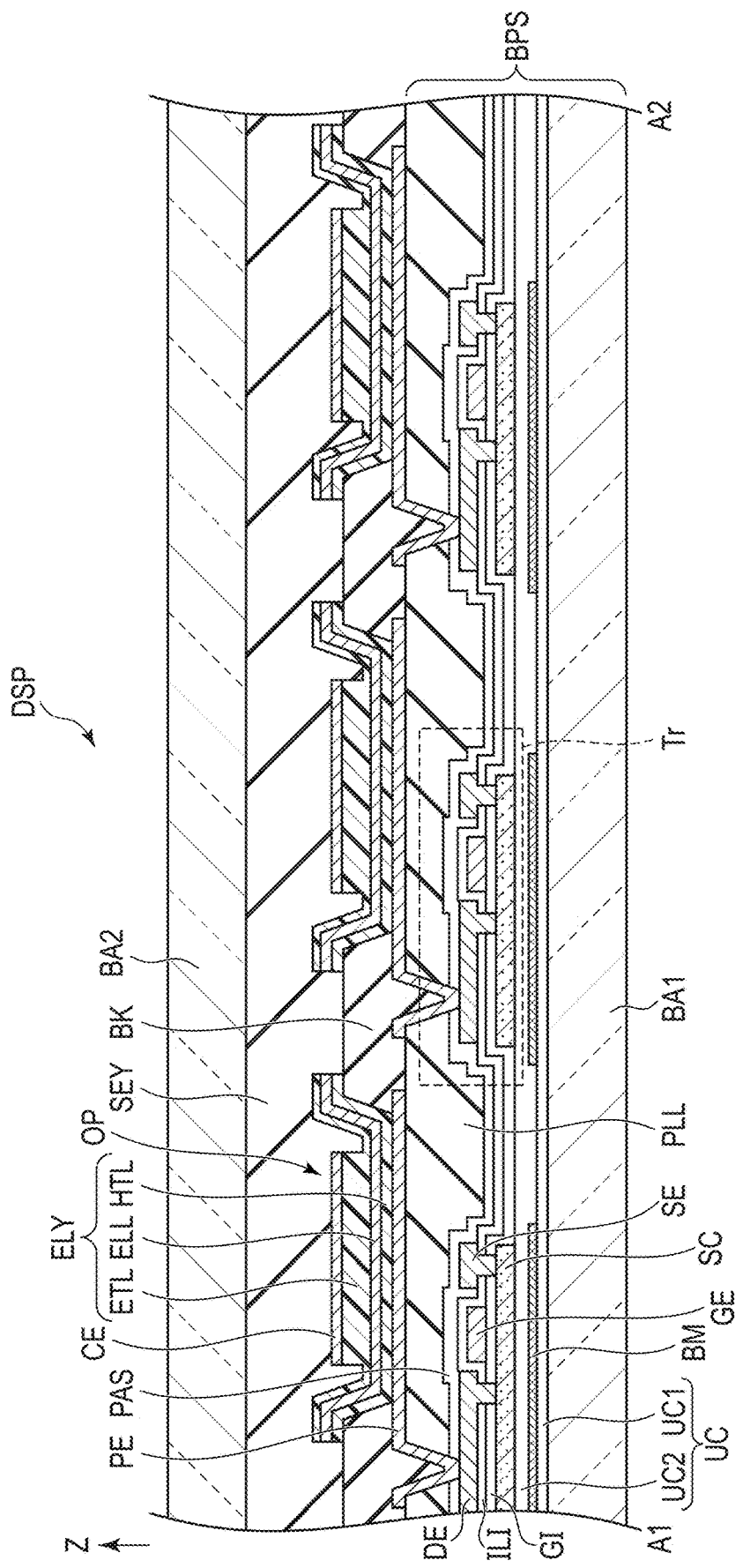
FIG. 3 is a cross-sectional view along line A1-A2 of the display device shown in FIG. 2.

FIG. 3 is a cross-sectional view along line A1-A2 of the display device shown in FIG. 2.

A base material BA1 may be a base material consisting of, for example, glass or a resinous material. For the resinous material, for example, acrylic, polyimide, polyethylene terephthalate and polyethylene naphthalate may be used. The resinous material may be formed by a single layer of any one of these components or by stacking a plurality of layers.

An insulating layer UC1 is provided on the base material BA1. For example, the insulating layer UC1 is formed by a single layer of a silicon oxide film or a silicon nitride film or by stacking the films.

A light-shielding layer BM may be provided on the insulating layer UC1 so as to overlap a transistor Tr. The light-shielding layer BM prevents the change in the transistor characteristics because of the incursion of light from the channel back surface of the transistor Tr, etc. When the light-shielding layer BM is formed by a conductive layer, a back gate effect can be caused to the transistor Tr by applying a predetermined potential.

An insulating layer UC2 is provided so as to cover the insulating layer UC1 and the light-shielding layer BM. For the insulating layer UC2, the same material as the insulating layer UC1 may be used. The insulating layer UC2 may be formed of a material different from that of the insulating layer UC1. For example, the insulating layer UC1 may be formed of silicon oxide, and the insulating layer UC2 may be formed of silicon nitride. The insulating layers UC1 and UC2 are collectively referred to as an insulating layer UC.

On the insulating layer UC, the transistor Tr is provided. The transistor Tr comprises a semiconductor layer SC, an insulating layer GI, a gate electrode GE (scanning line), an insulating layer ILI, a source electrode SE (signal line) and a drain electrode DE.

For the semiconductor layer SC, amorphous silicon, polysilicon or an oxide semiconductor is used.

For example, the insulating layer GI is provided by a single layer of silicon oxide or silicon nitride or by stacking them.

For the gate electrode GE, for example, molybdenum tungsten alloy (MoW) is used. The gate electrode GE may be integrally formed with a scanning line GL.

The insulating layer ILI is provided so as to cover the semiconductor layer SC and the gate electrode GE. For example, the insulating layer ILI is formed by a single layer of silicon oxide or silicon nitride or by stacking them.

The source electrode SE and the drain electrode DE are provided on the insulating layer ILI. The source electrode SE and the drain electrode DE are connected to the source region and drain region of the semiconductor layer SC, respectively, via the contact holes provided in the insulating layer ILI and the insulating layer GI. The source electrode SE may be integrally formed with a signal line.

An insulating layer PAS is provided so as to cover the source electrode SE, the drain electrode DE and the insulating layer ILI. An insulating layer PLL is provided so as to cover the insulating layer PAS.

The insulating layer PAS is formed of an inorganic insulating material. For example, the inorganic insulating material is prepared as a single layer of silicon oxide or silicon nitride or a stacked layer of these components. The insulating layer PLL is formed of an organic insulating material. The organic insulating material may be an organic material such as photosensitive acrylic or polyimide. By providing the insulating layer PLL, a step caused by the transistor Tr can be planarized.

On the insulating layer PLL, a pixel electrode PE is provided. The pixel electrode PE is connected to the drain electrode DE via a contact hole provided in the insulating layers PAS and PLL.

For example, the pixel electrode PE comprises a multi-layer structure of three layers of indium zinc oxide (IZO), silver (Ag) and IZO.

In the present embodiment, the configuration from the base material BA1 to the insulating layer PLL is defined as a backplane BPS.

A bank BK (a protrusion or a rib) is provided between adjacent pixel electrodes PE. For the bank BK, the same organic material as the insulating layer PLL is used. The bank BK is open so as to expose part of the pixel electrode PE. An end portion of an opening OP should preferably have a gentle taper shape in a cross-sectional view. If an end portion of the opening OP is steep, a coverage defect is cased in an organic EL layer ELY which is formed later.

The organic EL layer ELY is provided between adjacent banks BK so as to overlap the pixel electrode PE. The organic EL layer ELY includes a hole-transport layer HTL, a light emitting layer ELL and an electron-transport layer ETL. The detailed structures of the hole-transport layer HTL, the light emitting layer ELL and the electron-transport layer ETL are described later.

A common electrode CE is provided on the organic EL layer ELY. The common electrode CE is prepared by forming a magnesium-silver alloy (MgAg) film as a thin film to the extent that the emitted light from the organic EL layer ELY passes though the film. In the present embodiment, the pixel electrode PE is an anode, and the common electrode CE is a cathode. The light generated in the organic EL layer ELY is extracted to the upper side via the common electrode CE. In other words, the display device DSP comprises a top-emission structure. The details of the common electrode CE are also described later.

An insulating layer SEY is provided so as to cover the common electrode CE. The insulating layer SEY comprises a function of preventing liquid from entering the organic EL layer ELY from the outside. A material having a high gas barrier property is suitable for the insulating layer SEY. The insulating layer SEY may be, for example, an insulating layer in which an organic insulating layer is interposed between two inorganic insulating layers containing nitrogen. The material of the organic insulating layer may be acrylic resin, epoxy resin, polyimide resin, etc. The material of the inorganic insulating layers containing nitrogen may be, for example, silicon nitride or aluminum nitride.

A base material BA2 is provided on the insulating layer SEY. The base material BA2 is formed of the same material as the base material BA1. An inorganic insulating layer or organic insulating layer having translucency may be provided between the base material BA2 and the insulating layer SEY. The organic insulating layer may comprise a function of attaching the insulating layer SEY to the base material BA2.

Figure 4:
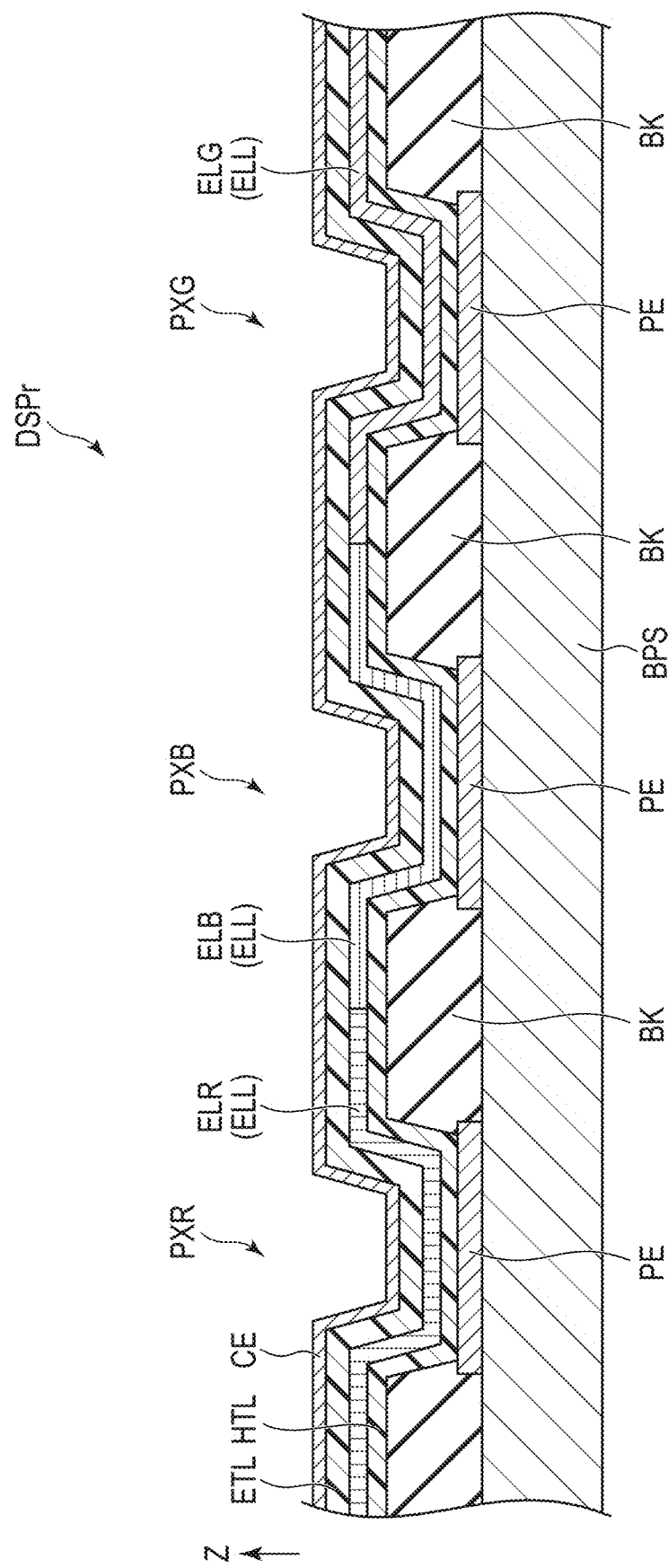
FIG. 4 is a cross-sectional view of a display device according to a comparative example.

FIG. 4 is a cross-sectional view of a display device according to a comparative example. In the display device DSPr shown in FIG. 4, a hole-transport layer HTL, an electron-transport layer ETL and a common electrode CE are provided over pixels PXR, PXG and PXB. In pixels PXR, PXG and PXB, light emitting layers ELR, ELG and ELB are provided, respectively, as light emitting layers ELL. Regarding light emitting layers ELR and ELG, light emitting layers ELG and ELB, and light emitting layers ELB and ELR, an end portion is in contact with an end portion of the light emitting layer of an adjacent pixel.

Figure 5:
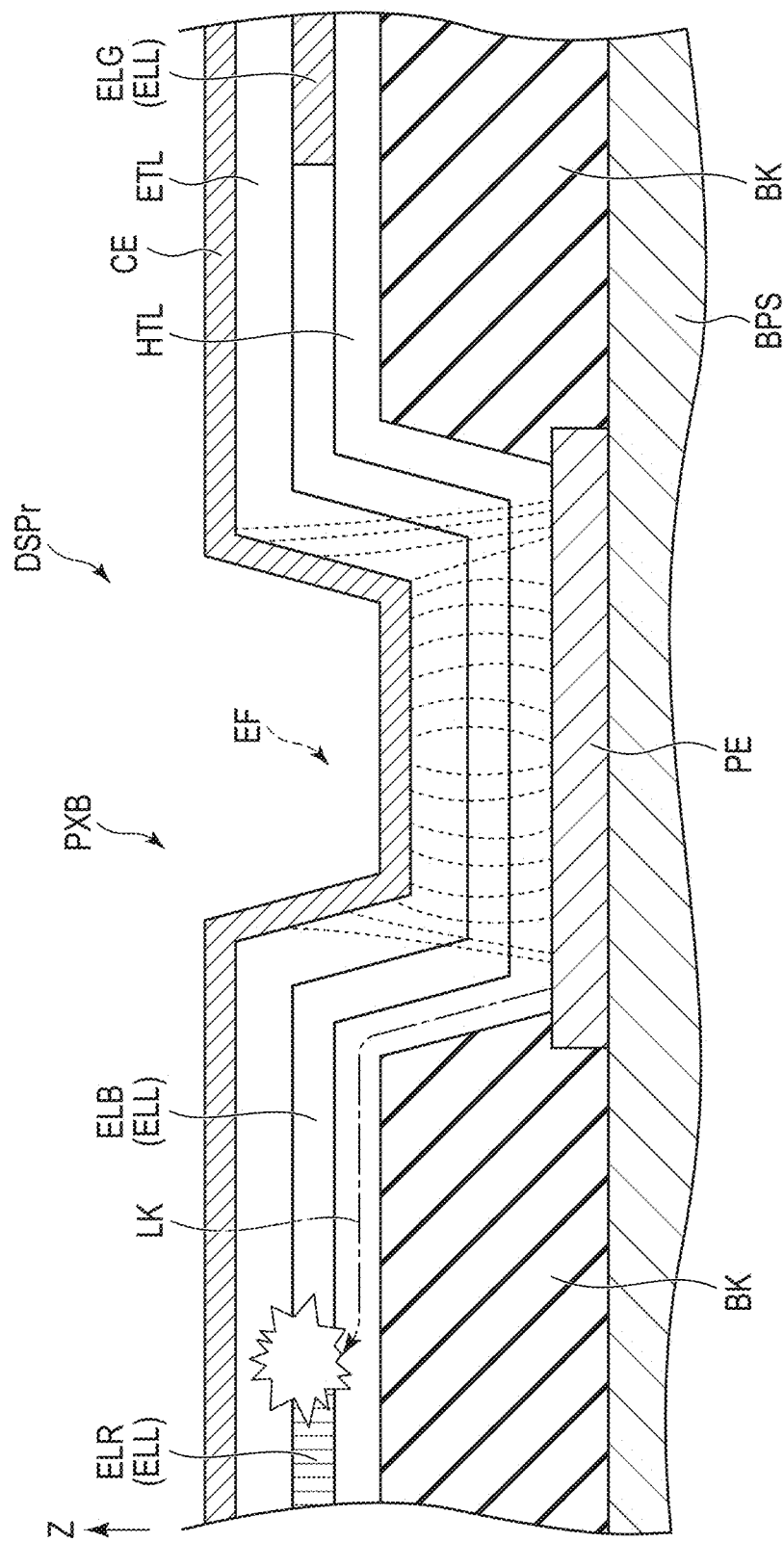
FIG. 5 is a cross-sectional view in which part of FIG. 4 is enlarged.

FIG. 5 is a cross-sectional view in which part of FIG. 4 is enlarged. For example, FIG. 5 shows an expanded cross-sectional view of pixel PXB. To simplify the figure, the hatching of some structural elements is omitted. Between the pixel electrode PE (anode) and the common electrode CE (cathode), an electric field EF is generated based on the applied voltage. As the common electrode CE is provided to the extent of the adjacent pixel PX, pixel PXB is not subjected to element separation or does not have a structure of current constriction. In this case, the electric field EF extends to the adjacent pixel PX as well as between the pixel electrode PE of pixel PXB and the area of the opposed common electrode CE.

If the electric field EF extends, because of the characteristics between the voltage V applied to the pixel PX and the flowing current I (VI characteristics), for example, the threshold Vth may be increased, or the slope efficiency which is the inclination of light output for current I may be decreased. As a result, the efficiency of extraction of light in the pixel PX is decreased.

Further, when light emitting layer ELB emits light, a positive hole may flow through the hole-transport layer HTL, and thus, leak current LK may be generated. When the positive hole reaches light emitting layer ELR of the adjacent pixel PXR and light emitting layer ELG of pixel PXG, light emitting layers ELR and ELG may unintentionally emit light.

In the present embodiment, the hole-transport layer HTL, the electron-transport layer ETL and the common electrode CE are provided individually for each pixel PX, and the film thickness of the electron-transport layer ETL is changed for each pixel PX. In this way, a structure of current constriction is realized. Thus, the efficiency of extraction of light in each pixel PX can be improved. Moreover, the element separation for each pixel PX can prevent the generation of leak current and the unintentional light emission of a light emitting layer.

Figure 6:
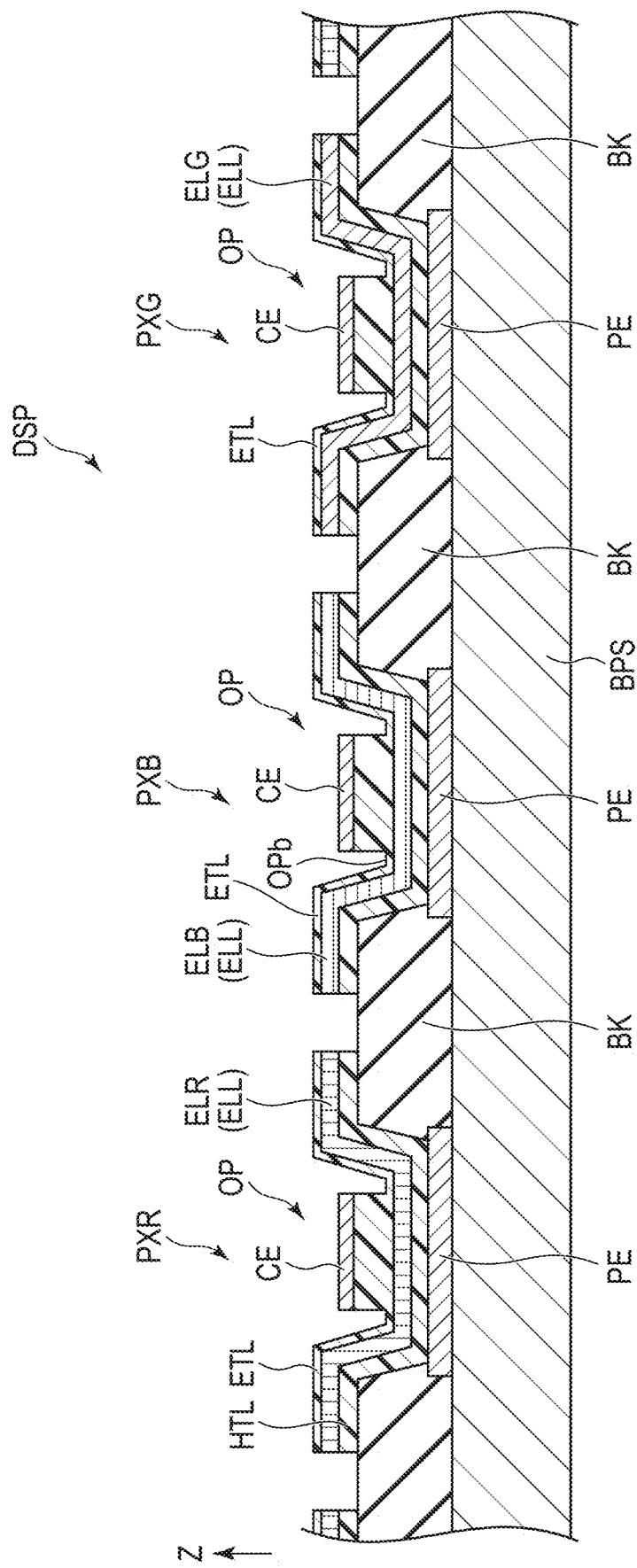
FIG. 6 is a cross-sectional view showing an example of the general configuration of the display device according to the present embodiment.
Figure 7:
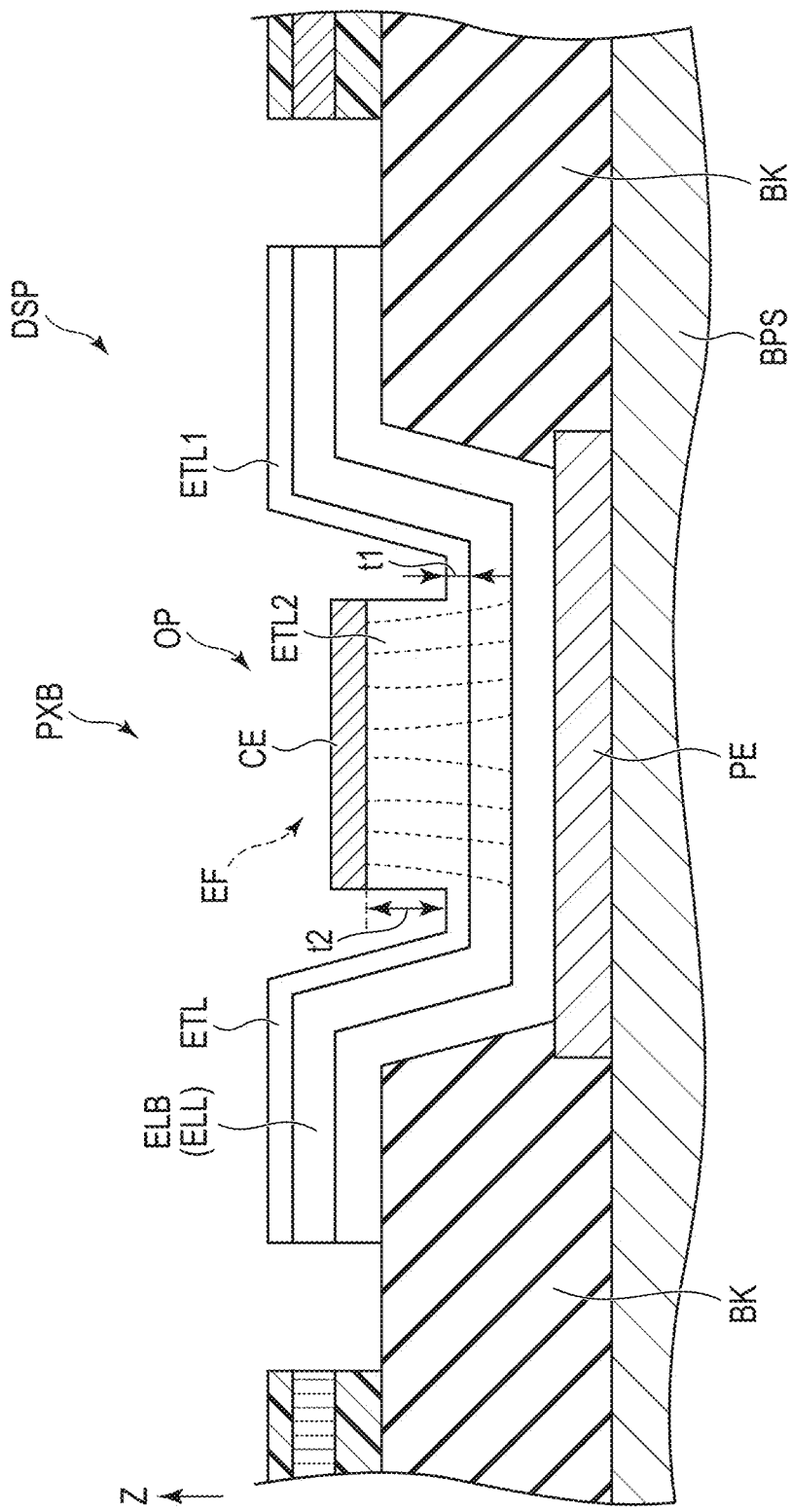
FIG. 7 is a cross-sectional view in which part of FIG. 6 is enlarged.

FIG. 6 is a cross-sectional view showing an example of the general configuration of the display device according to the present embodiment. FIG. 7 is a cross-sectional view in which part of FIG. 6 is enlarged. In pixels PX (PXR, PXG and PXB), the hole-transport layer HTL, the light emitting layer ELL (ELR, ELG or ELB), the electron-transport layer ETL and the common electrode CE are provided individually for each pixel PX. In other words, the hole-transport layer HTL, light emitting layer ELL, electron-transport layer ETL or common electrode CE provided in a pixel PX is not in contact with the hole-transport layer HTL, light emitting layer ELL, electron-transport layer ETL or common electrode CE provided in an adjacent pixel PX.

The electron-transport layer ETL of each pixel PX comprises a thin first area ETL1 and a thick second area ETL2. The second area ETL2 is provided inside the opening OP. An end portion of the second area ETL2 is spaced apart from an end portion of the bottom portion of the opening OP. The film thicknesses of the first area ETL1 and the second area ETL2 are defined as t1 and t2, respectively. It is desirable that film thickness t1 should be approximately 10% of film thickness t2. For example, when film thickness t2 is 50 nm, film thickness t1 should be desirably 5 nm.

The second area ETL2 overlaps the common electrode CE, whereas the first area ETL1 does not overlap the common electrode CE.

The first area ETL1 and the second area ETL2 are formed in the following manner. First, the film which is the material of the electron-transport layer ETL is formed so as to have film thickness t2. Subsequently, the film which is the material of the common electrode CE is formed. Subsequently, the portion to be the first area ETL1 may be etched so as to have film thickness t1 while covering the portion to be the second area ETL2 and the portion to be the common electrode CE with a mask. This etching may be either dry etching or wet etching.

If the portion to be the second area ETL2 is etched, the light emitting layer ELL provided on the lower side may be damaged.

Conversely, if the electron-transport layer ETL is provided so as to have film thickness t2 without conducting etching, an effect of current constriction may not be sufficiently obtained.

In the example shown in FIG. 6 and FIG. 7, when a predetermined voltage is applied to the pixel electrode PE and the common electrode CE, an electric field EF is generated in only the second area ETL2 overlapping the common electrode CE. The electric field EF does not extend to the first area ETL1 which does not overlap the common electrode CE. Since film thickness t1 of the first area ETL1 is less, electrons do not move from the second area ETL2 to the first area ETL1, and thus, leak current is not generated. In the present embodiment, the electric field EF can be generated in only the second area ETL2, and thus, a structure of current constriction can be realized.

Figure 8:
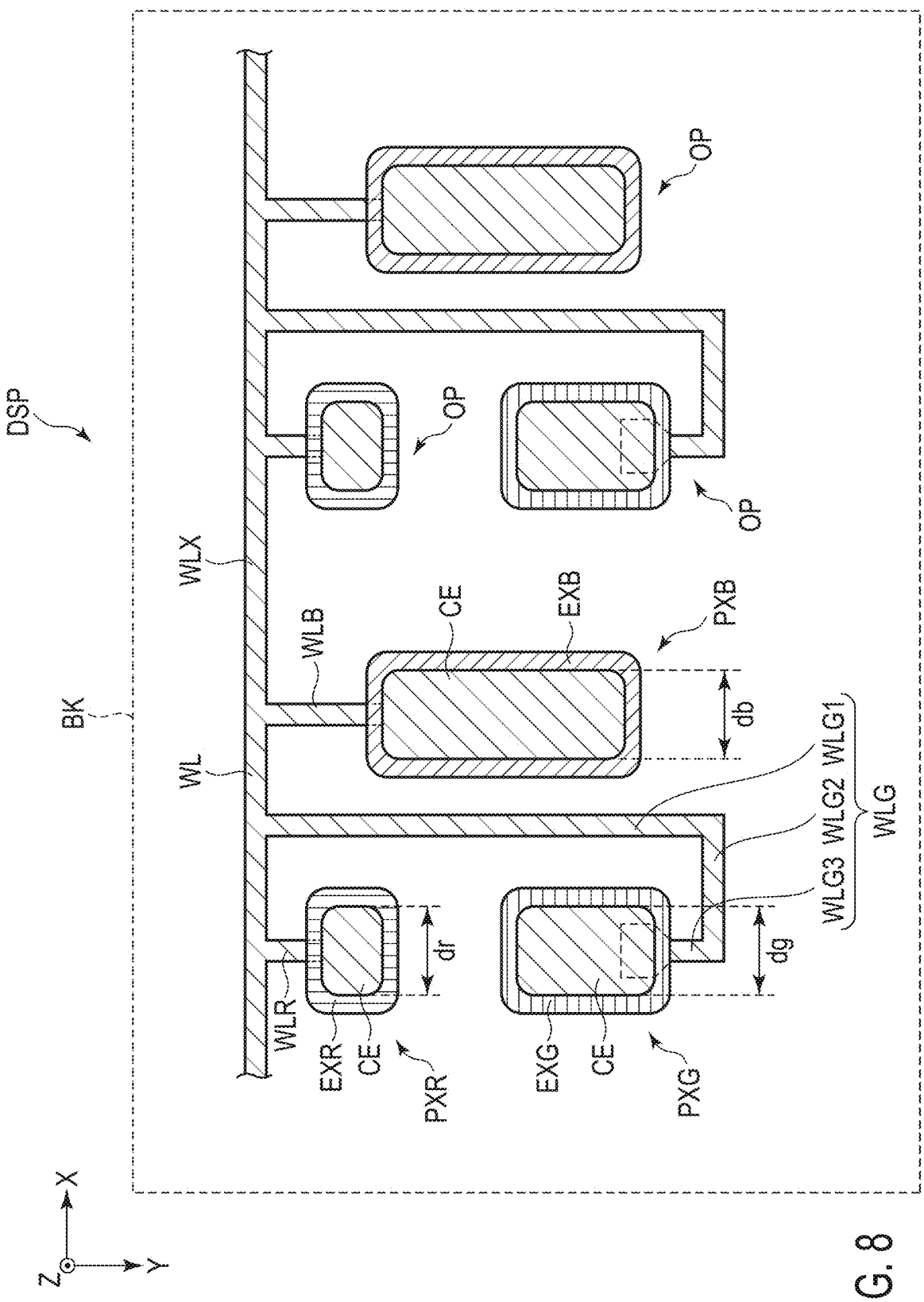
FIG. 8 is a plan view of a display device comprising a rectangular hole-transport layer, a rectangular light emitting layer, a rectangular second area provided in an electron-transport layer and a rectangular common electrode.
Figure 9:
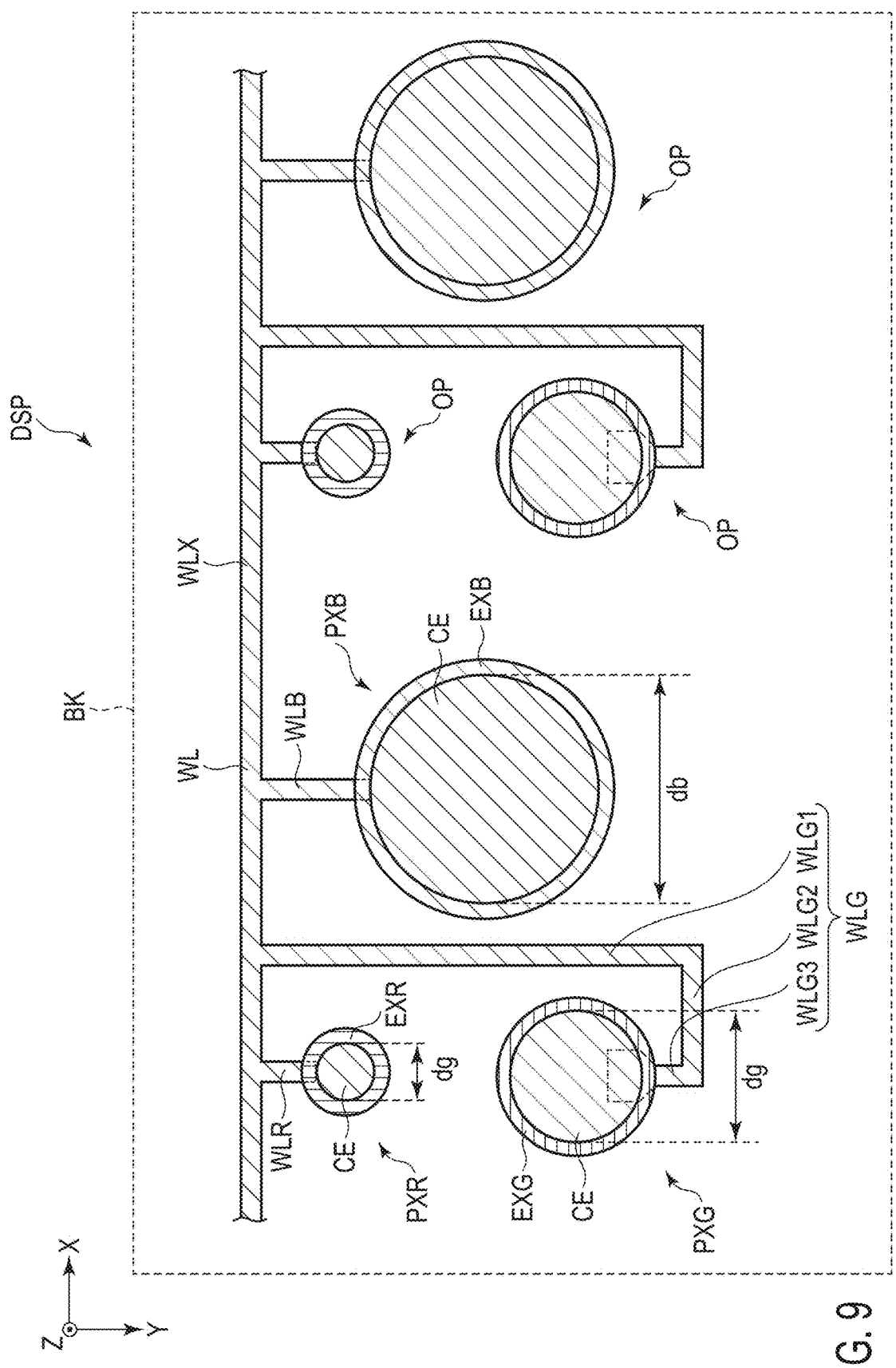
FIG. 9 is a plan view of a display device comprising a circular hole-transport layer, a circular light emitting layer, a circular second area provided in an electron-transport layer and a circular common electrode.

The planar shapes of the hole-transport layer HTL, the light emitting layer ELL, the second area ETL2 of the electron-transport layer ETL and the common electrode CE may be, for example, rectangular shapes or circular shapes. FIG. 8 is a plan view of a display device comprising a rectangular hole-transport layer, a rectangular light emitting layer, a rectangular second area provided in an electron-transport layer and a rectangular common electrode. FIG. 9 is a plan view of a display device comprising a circular hole-transport layer, a circular light emitting layer, a circular second area provided in an electron-transport layer and a circular common electrode.

In FIG. 8 and FIG. 9, the common electrode CE and the second area have the same planar shape. The first area ETL1, the light emitting layer ELL and the hole-transport layer HTL have the same planar shape. In FIG. 8 and FIG. 9, to simplify the figures, the planar shape of the common electrode CE and the planar shape of the light emitting layer ELL are shown, and the illustration of the other structural elements having the same planar shapes is omitted. In FIG. 8, the common electrode CE and the light emitting layer ELL have rectangular shapes as seen in plan view. In FIG. 9, the common electrode CE and the light emitting layer ELL have circular shapes as seen in plan view. In FIG. 8 and FIG. 9, the openings OP provided in the bank BK have the same shapes as the common electrodes CE and the light emitting layers ELL.

The lengths of the common electrodes CE of pixels PXR, PXG and PXB in the first direction X are defined as dr, dg and db, respectively. In FIG. 8, the lengths correspond to the long sides or short sides of the common electrodes CE. In FIG. 9, the lengths correspond to the diameters of the common electrodes CE.

The lengths (diameters) of the common electrode CE and second area ETL2 having a circular shape in FIG. 9 should be preferably greater than or equal to 3 µm and less than or equal to 10 µm, more preferably, greater than or equal to 1 µm and less than or equal to 3 µm. In a pixel PX having this range regarding the length, an effect of current constriction can be obtained, and the extension of an electric field can be prevented.

When the lengths are greater than or equal to 10 µm, an effect of element separation can be obtained. However, an effect of electric field constriction cannot be obtained. Thus, an electric field may extend. It is desirable that the lengths should be greater than or equal to 3 µm and less than or equal to 10 µm.

A line WL connected to the common electrode CE comprises lines WLX, WLR, WLG and WLB. Line WLX extends in the first direction X. Line WLR extends from line WLX in the second direction Y and is connected to the common electrode CE of pixel PXR. Line WLB extends from line WLX in the second direction Y and is connected to the common electrode CE of pixel PXB.

Line WLG comprises lines WLG1, WLG2 and WLG3 and is connected to the common electrode CE of pixel PXG. Line WLG1 extends in the second direction Y. Line WLG2 extends in the first direction X. Line WLG3 extends in the second direction Y and is connected to the common electrode CE. In the connection portion of line WLG3 and the common electrode CE, the width of line WLG3 should be preferably made great. By making the width of line WLG great, the attachment area of the common electrode CE and line WLG3 can be made great. In a structure having a dense electric field, light emission is intense in the portion. However, by making the attachment area of the common electrode CE and line WLG3 great, a dense electric field can be prevented. The prevention of a dense electric field allows the reduction in leak current into lines around each pixel. Thus, light emission can be prevented.

In the above descriptions, the structure of each pixel PX used for the display device DSP is explained. However, the present embodiment is not limited to a display device. The configuration of the pixel electrode PE, hole-transport layer HTL, light emitting layer ELL, electron-transport layer ETL and common electrode CE of the present embodiment can be also used as, for example, the light source of an organic laser irradiation device.

The display device of the present embodiment can prevent the reduction in the efficiency of extraction of light, the generation of leak current and unintentional light emission of a light emitting layer by realizing a structure of element separation and a structure of current constriction. In this way, the brightness of the light emitted from the display device and the reliability can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising a pixel comprising a pixel electrode, a hole-transport layer, a light emitting layer, an electron-transport layer and a common electrode, wherein
    end portions of the hole-transport layer, the light emitting layer and the electron-transport layer provided in the pixel are spaced apart from end portions of a hole-transport layer, a light emitting layer and an electron-transport layer of an adjacent pixel,
    the electron-transport layer comprises a first area having a first film thickness, and a second area having a second film thickness greater than the first film thickness, and
    the second area overlaps the common electrode, and the first area does not overlap the common electrode.

2. The display device according to claim 1, wherein the second area and the common electrode have a rectangular shape in plan view.

3. The display device according to claim 1, wherein the second area and the common electrode have a circular shape in plan view.

4. The display device according to claim 3, wherein a diameter of the circular shape is greater than or equal to 3 µm and less than or equal to 10 µm.

5. The display device according to claim 4, wherein the diameter of the circular shape is greater than or equal to 1 µm and less than or equal to 3 µm.

6. The display device according to claim 1, wherein the first film thickness is 10% of the second film thickness.

* * * * *